United States Patent [19]
Ledger

[11] Patent Number: 5,436,725
[45] Date of Patent: Jul. 25, 1995

[54] COFOCAL OPTICAL SYSTEM FOR THICKNESS MEASUREMENTS OF PATTERNED WAFERS

[75] Inventor: Anthony M. Ledger, New Fairfield, Conn.

[73] Assignee: Hughes Aircraft Company, Los Angeles, Calif.

[21] Appl. No.: 134,729

[22] Filed: Oct. 12, 1993

[51] Int. Cl.$^6$ ............................................. G01B 11/02
[52] U.S. Cl. .................... 356/357; 356/381; 356/382
[58] Field of Search .................. 356/382, 381, 357

[56] References Cited

U.S. PATENT DOCUMENTS

| | | | |
|---|---|---|---|
| 4,320,967 | 3/1982 | Edgar | 356/382 |
| 4,687,333 | 8/1987 | Odasima et al. | 356/382 |
| 4,845,373 | 7/1989 | Jamieson et al. | 356/400 |
| 5,050,923 | 10/1991 | Ebisawa et al. | 356/382 |
| 5,291,269 | 3/1994 | Ledger | 356/357 |
| 5,293,214 | 3/1994 | Ledger | 356/357 |

Primary Examiner—Richard A. Rosenberger
Assistant Examiner—Jason D. Eisenberg
Attorney, Agent, or Firm—W. C. Schubert; W. K. Denson-Low

[57] ABSTRACT

An optical system for providing low and high resolution images of a patterned wafer to provide for film thickness measurements thereof. The optical system comprises a spectrally filtered light source for providing light to illuminate the wafer. A low resolution imaging system is provided for imaging the wafer at a relatively low resolution. A high resolution imaging system is provided for imaging a subarea of the wafer at a relatively high resolution to create an enlarged image in the same object plane as the wafer. An image producing system is provided for producing a visual image of the wafer derived from the low and high resolution images. The high resolution imaging system uses subaperture optical elements, comprising either a small scanning lens or a sparse array of lenses, to image small areas of the wafer at higher resolution, and the subaperture optical elements create an enlarged image in the same object plane as the actual wafer. Both areas are then imaged onto the image producing system such as a CCD array of a CCD camera, by the low resolution imaging system (a lens or reflector) to provide a common or cofocal feature of the present invention. This arrangement avoids frequent refocussing to make thickness measurements on different parts of the wafer. The present invention allows the determination of thin film thicknesses of patterned wafers, planar wafers, and silicon-on-insulator (SOI) wafers, even though the spatial frequencies of the patterns are radically different in all these cases. The present invention provides the ability to make thickness maps of magnified regions within a semiconductor chip as well as test pads located in scribe alleys thereon. The use of high resolution multispectral subimages significantly increases the speed at which thickness maps of these patterned regions are generated. The invention may also be used to measure the that also allows determination of position and orientation of the wafer since the wafer edges are in focus.

13 Claims, 3 Drawing Sheets

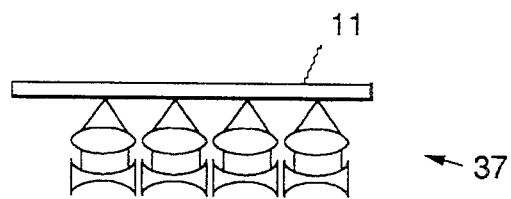
Fig. 1a
Fig. 1b
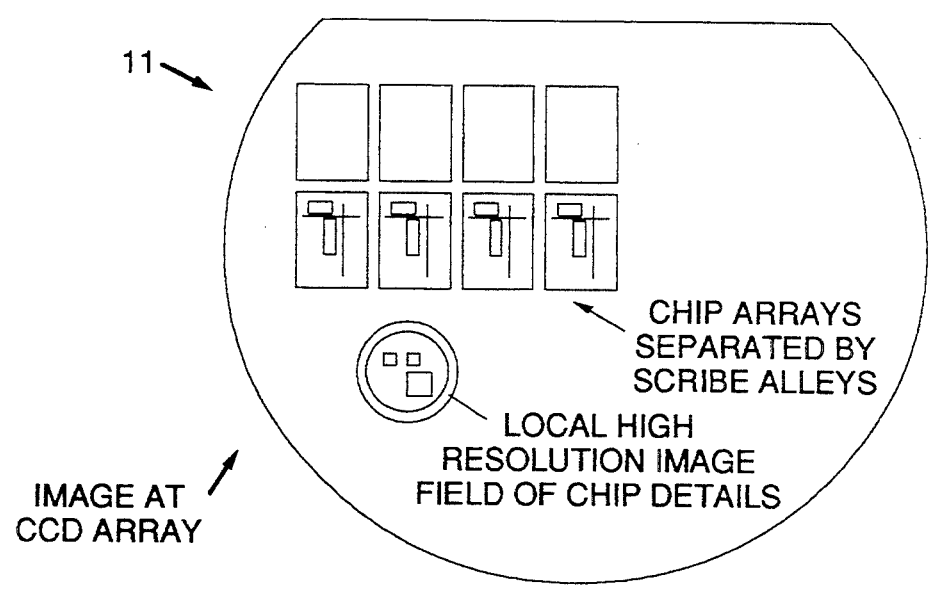

COFOCAL CONDITION IS $U_1 + U_2 + V_1 + V_2 = 0$

COFOCAL OPTICAL SYSTEM FOR THICKNESS MEASUREMENTS OF PATTERNED WAFERS

BACKGROUND

The present invention relates generally to film thickness measurement systems, and more particularly, to cofocal optical systems for making film thickness measurements on patterned wafers.

Many steps are needed to complete the fabrication of a semiconductor chip and it is often desirable to measure the thickness of thin film layers thereof to view features in the 10 to 100 micron lateral size range. This is typically done by scanning a single point high resolution optical probe across the surface of the wafer and making measurements sequentially.

Typically, a full wafer imaging system requires either a large refractive lens assembly, a parabola-based reflector system, or the use of a spherical vacuum chuck to form the wafer into a shallow sphere. In the case of the refractive and reflective systems, the size of the optical elements approaches the size of the largest wafer that is to be measured. These large optics requirement leads to high cost and the optical elements require careful optical design. Forming the wafer into a shallow sphere provides an excellent way of avoiding high cost optical elements although the deformation of the wafer during chip fabrication may be viewed with suspicion and this practice will not work at all if the ambient environment is a vacuum, such as in an automated ultraclean wafer process line.

Prior whole-wafer film thickness mappers require measurement of multispectral reflectance over a full aperture of the imaging and these mappers generally fall into two categories. In the first category, the entire wafer is imaged onto a NxN pixel CCD array (512×512, 1024×1024, or 2048×2048, for example) to provide a spatial resolution at the wafer plane of approximately 200 microns per pixel. In the second category, a CCD array attached to a conventional narrow-field microscope is used provide high resolution in the 1 to 5 micron per pixel range. However, covering the whole wafer requires mechanical scanning of the entire wafer or optical head.

Accordingly, it is an objective of the present invention to provide for a film thickness measurement system that overcomes the limitations of conventional systems. It is a further objective of the present invention to provide for cofocal optical systems for making film thickness measurements on patterned wafers.

SUMMARY OF THE INVENTION

The present invention combines both aspects of prior art systems into a single optical system by providing a means for imaging the full wafer at low resolution (200 microns per pixel) and also providing a means for imaging one or more high resolution subfields at a resolution in the 5 to 10 micron per pixel range at the wafer surface. A large feed lens or reflective optical system lens is used to image the entire wafer at lower resolution. Subaperture optical elements, comprising either a small scanning lens or a sparse array of lenses, are used to image small areas of the wafer at higher resolution and the subaperture optical elements create an enlarged image in the same object plane as the actual wafer. Both areas are then imaged onto a CCD array of a CCD camera by a single lens or reflector to provide a common or cofocal feature of the present invention. This arrangement avoids frequent refocussing to make thickness measurements on different parts of the wafer.

More particularly, the present optical system comprises a spectrally filtered light source for providing light to illuminate the patterned wafer. A low resolution imaging system is provided for imaging the wafer at a relatively low predetermined resolution. A high resolution imaging system is provided for imaging a subarea of the wafer at a relatively high predetermined resolution to create an enlarged image in the same object plane as the wafer. An image producing system is provided for producing a visual image of the wafer derived from the images provided by the low and the high resolution imaging systems.

The present invention provides a simplified and inexpensive full-wafer imaging system that incorporates a scanning cofocal optical system to view a patterned silicon wafer at two or more different magnifications. This type of optical system images the whole wafer onto the CCD camera and in addition allows small magnified areas of the wafer to be viewed by the same CCD camera, wherein the full wafer and local, high resolution images are in focus at the same plane (cofocal). The high resolution image regions may be selected by moving the cofocal optical system (the small scanning lens or the sparse array of lenses) across the wafer.

The present invention allows the determination of thin film thicknesses of patterned wafers, planar wafers, and silicon-on-insulator (SOI) wafers, even though the spatial frequencies of the patterns are radically different in all these cases. As stated above, it is often desirable to measure the thickness of thin film layers in features in the 10 to 100 micron lateral size range. The present invention retains the full wafer imaging and thickness mapping capabilities provided by conventional imaging systems and adds the ability to make thickness maps of magnified regions within a semiconductor chip as well as test pads located in scribe alleys thereon. The use of high resolution multispectral subimages provided by the present invention significantly increases the speed at which thickness maps of these patterned regions are generated.

The present invention thus provides a means for making thickness determinations of films including low frequency planar layers on silicon wafers for uniformity determination, SOI wafers and particularly ones containing high slope regions, and patterned wafers where the lateral feature size is in the 10 to 100 micron range. The optical system of the present invention may be implemented in the form of a scanning system for performing diagnostic tests in any part of a wafer that is processed, or it may be used in a production mode wherein the subaperture optical elements (scanning lens or sparse array of lenses) makes measurements of small features at predetermined locations on the wafer, either in the chip region, the scribe alleys, or on test pads located on the surface of the wafer. The present invention also provides an image of the wafer which may be used for wafer alignment (i.e., determining wafer position and orientation).

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1a illustrates an embodiment of the optical system of FIG. 1 employing a sparse array of lenses as a cofocal optical element thereof;

FIG. 1b illustrates an enlarged image of a wafer imaged by the optical system of the present invention.

DETAILED DESCRIPTION

Figure 1:
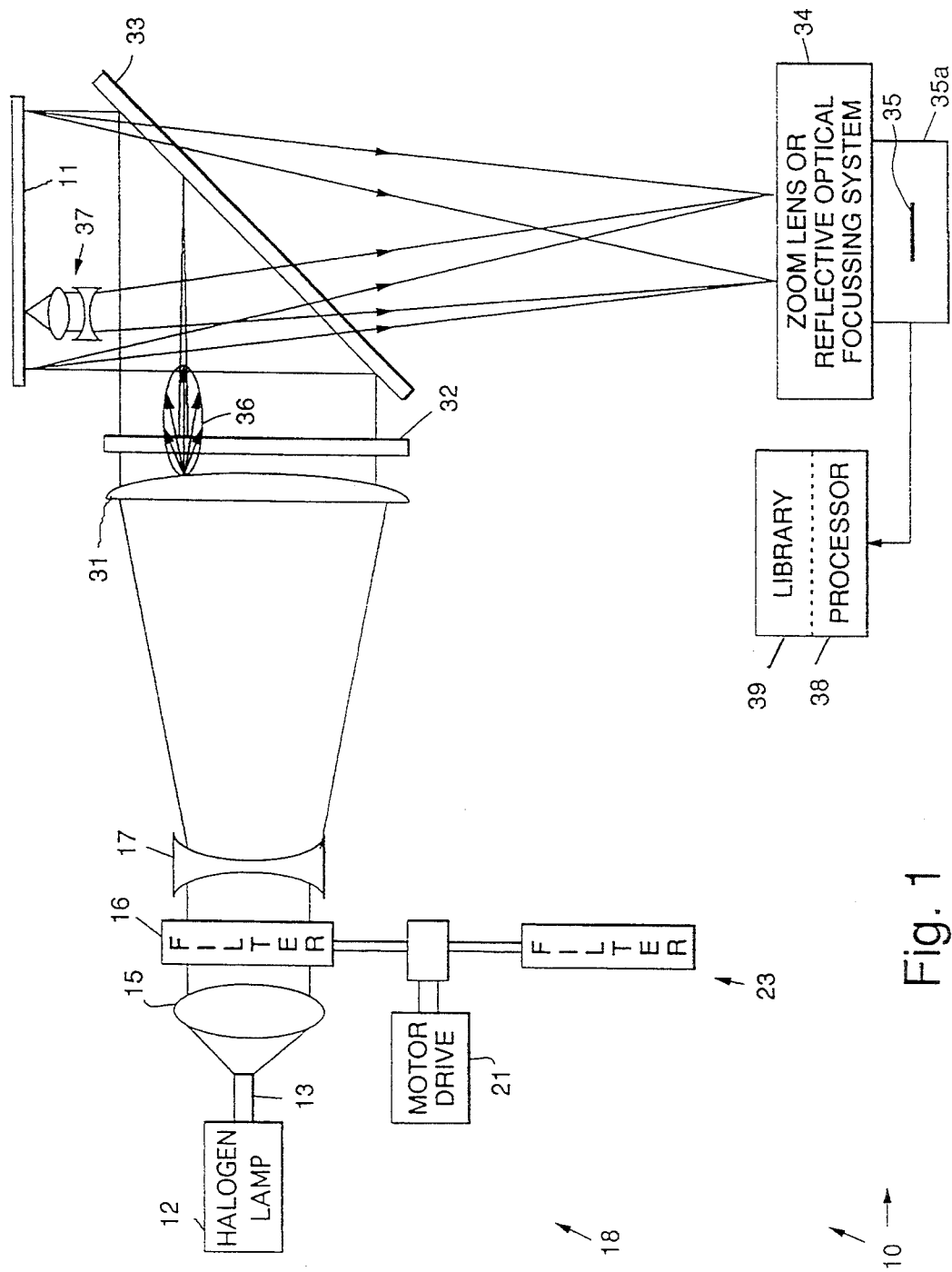
FIG. 1 illustrates an optical system in accordance with the principles of the present invention employing a scanning lens as a cofocal optical element thereof, and that is adapted to make film thickness measurements on patterned wafers.

Referring to the drawing figures, FIG. 1 illustrates one embodiment of an optical system 10 in accordance with the principles of the present invention employing a scanning lens as a cofocal optical element thereof, and that is adapted to make film thickness measurements of a patterned wafer 11. The optical system 10 is comprised of a high intensity light source 12, such as a halogen lamp 12, whose output is coupled by way of a fiber optic bundle 13, for example, to a lens group comprising a concave lens 15 and a convex lens 17. A motor drive 21 is coupled to a filter wheel 23 and is provided to filter the light provided by the halogen lamp 12. The filter wheel 23 is adapted to insert one of a plurality of filters 16 between the concave lens 15 and a convex lens 17. The filters 16 are employed to filter the light from the light source 12 and provide for illuminating light in selected regions of the spectrum. The use of the high intensity light source 12 and the filter wheel 23 provides for a spectrally filtered light source 18.

The output of the a convex lens 17 is applied to a collimating lens 31 that may be made of plastic, for example, that collimates the filtered light from the halogen lamp 12 and images it through a ground glass plate or surface 32 that acts as a diffuser 32. The diffuser 32 causes the light to scatter and produces a forward scatter envelope 36 for each point of light projected by the collimating lens 31. The light output from the diffuser 32 is applied to a beamsplitter 33 and the the reflected portion of the light illuminates a wafer 11. The light incident on the wafer 11 is reflected therefrom and this light is imaged by a zoom lens 34 through the beamsplitter 33 on onto a CCD array 35 of a CCD camera 35a. A moveable cofocal optical system 37 comprising one of a plurality of subaperture optical elements, and which comprise a small scanning lens system 37 or a sparse array of lenses 37 (shown in FIG. 1a) is used to image small areas of the wafer 11 at higher resolution. The subaperture optical elements create an enlarged image in the same object plane as the wafer 11 and that is viewed by the camera 35a. The zoom lens 34 provides a means for imaging the full wafer at 200 microns per pixel resolution, for example, and the moveable cofocal optical system 37 provides a means for imaging the surface of the wafer 11 to provide for one or more high resolution subfields at a resolution in the 5 to 10 micron per pixel range, for example, at the surface of the wafer 11.

For the purposes of completeness, FIG. 1a shows a portion of the optical system 10 that includes a cofocal optical system 37 that comprises the sparse array of lenses 37 in place of the small scanning lens system 37. The design of the sparse array of lenses 37 is considered routine to those skilled in the art and will not be described in detail herein.

The optical system 10 of FIGS. 1 and 1a are designed to provide two distinct functions. First the optical system 10 allows wafers having up to a 200 mm diameter to be illuminated by diffused light from the spectrally filtered light source 18. The diffused nature of the incident light at the wafer 11 eliminates the need to mount the wafer 11 on a vacuum chuck, since light is incident on the wafer 11 at a large range of angles. Second, the small moveable cofocal optical systems 37 may be placed anywhere in front of the wafer 11 under test to allow higher spatial resolution measurements of film thickness to be made over selected regions when diagnostic wafer measurements are made. Process control measurements usually require measurements at fixed locations and this may be accomplished by using multiple optical cofocal assemblies in the form of the sparse array of lenses 37 placed over the regions of interest.

The present invention eliminates the requirement for large high quality optical elements and additionally does not require that the wafer 11 be vacuum-chucked to a flat or spherical shape, to match the field curvature of the investigating optical system. The spectrally variable light source 18 used in the optical system 10 may be comprised of a 150 watt halogen lamp 12, for example, whose light output is coupled through the optical filter 16 by a conventional fiber optic light waveguide comprising the fiber optic bundle 13. This arrangement is adapted to sequentially illuminate the surface of the wafer 11 with a large number of narrow band wavelengths of light. The light from the filtered light source 18 is expanded and roughly collimated by the relatively large plastic collimating lens 31 and scattered by the ground glass screen 32 or diffuser 32 onto the surface of the wafer 11. In practice, the plastic collimating lens 31 improves the illumination uniformity, and it has a size that is at least equal to the size the largest wafer 11 that is to be measured. The relatively large beamsplitter 33 may be made of window glass coated with a partially transparent protected silver coating, and is used to collect light reflected from the wafer 11 and direct it to the zoom lens 34 and CCD camera 35a which views the entire wafer 11. The present system 10 has been assembled in a laboratory environment and provides high light levels at the CCD camera 35a as well as excellent digitized images of SOI and planar coated wafers 11.

The CCD camera 35a used in a preferred embodiment of the optical system 10 comprises a 512×512 CCD array 35 which can only resolve 400 microns at the wafer 11 if the entire 200 mm wafer 11 is matched to the maximum array size (1024×1024). Images of pattered wafers 11 have small rectangular features in the micron level cannot be resolved at this low magnification. These features are resolved by employing the small cofocal optical system 37 disposed near the surface of the wafer 11. The cofocal optical system 37 is designed to magnify a small portion of the surface of the wafer 11 by from ten to twenty times. If this scheme is used in conjunction with a 1024 line CCD camera 35a (pixel size at the wafer 11 is 200 micron per pixel), then a magnification of 20 times using the cofocal optical system 37 and additional magnification using the zoom lens 34 allows features in the tens of microns to be imaged at the same focal point.

Thickness measurements at any point on the wafer 11 are made by forming images of the wafer 11 on the CCD camera 35a at various monochromatic wavelengths in the visible region of the spectrum. The images are digitized by a frame grabber for example, and then data is coupled to a processor 38 or computer 38 that is used to derive the spatial variations of the reflectance of the wafer 11 caused by differing thicknesses of the film. In the case of an SOI wafer 11, for example, a library 39 of reflectance values for different values of the outer film thickness of the wafer 11 is precalculated at all of the different wavelengths and is used to find a match between the measure sampled spectral reflectances generated by the system 10 and the precalculated sampled spectrum stored in the library 39 by using a conventional least squares fitting technique.

In general, this least squares pattern matching technique may be used to measure the thickness of any layer (and possibly two layers) if the reflectance of the wafer 11 is accurately modeled from an accurate knowledge of the optical constant of the materials in the layers of the wafer 11. Therefore, thickness measurements of high resolution images of integrated circuit (IC) structures provides accurate thickness measurements if the images truly represent changes in reflectance of IC structures in a chip pattern and if the optical constants are well characterized.

Referring to FIG. 1b, it illustrates an enlarged image of the wafer 11 imaged by the optical system 10 of the present invention. FIG. 1b shows an in focus image including the wafer edges and alignment features on the periphery of the wafer 11. The wafer may be configured with flat edges or notches or other features that assist in registration and location. The present optical system 10 is adapted to ensure that the surface of the wafer 11 and IC structures thereon appear to be located at the same plane so that both images are focussed onto the CCD array 35 by the common zoom lens 34. When this is accomplished, the full aperture images may be used for thickness measurements on areas that are greater than 400 microns in extent, as is the case for the special test pads used for process control. Other test areas in scribe alleys (100 micron×1000 microns long) may also be used for thickness measurement resolution, and better than 50 micron per pixel may be achieved. To obtain higher resolution in the range of 5 microns/pixel requires sufficient color correction (the wavelength region needing color correction is from 4000 Å to 8000 Å) and is a matter of detailed optical design.

Figure 2A:
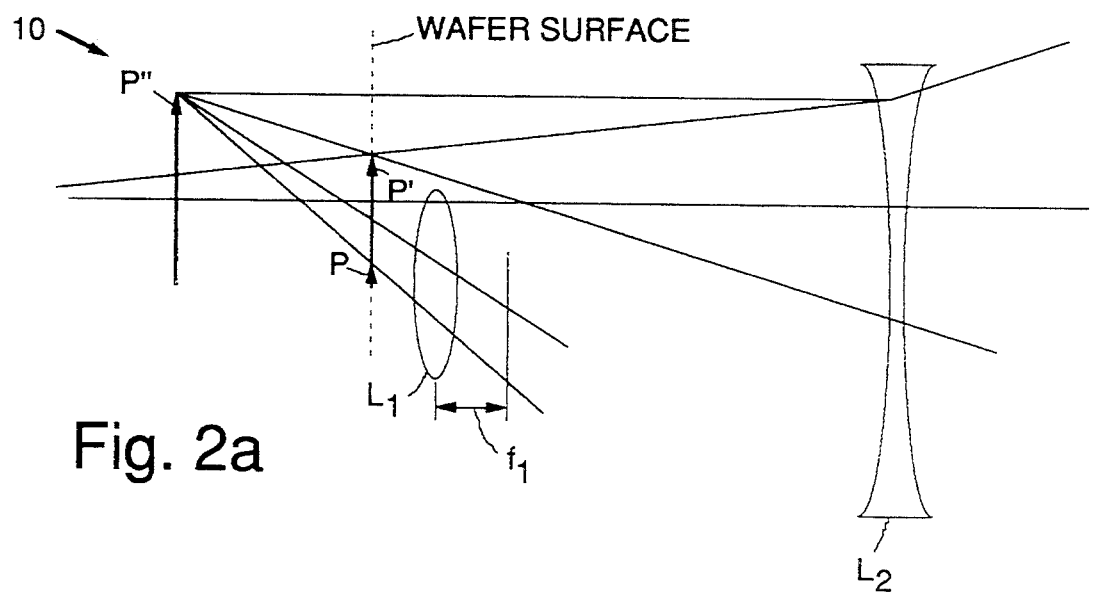
FIGS. 2a and 2b show paraxial solutions to the problem of inserting a magnifying system into an optical system without causing the final focal point to shift and which are employed in the optical system of the present invention.
Figure 2B:
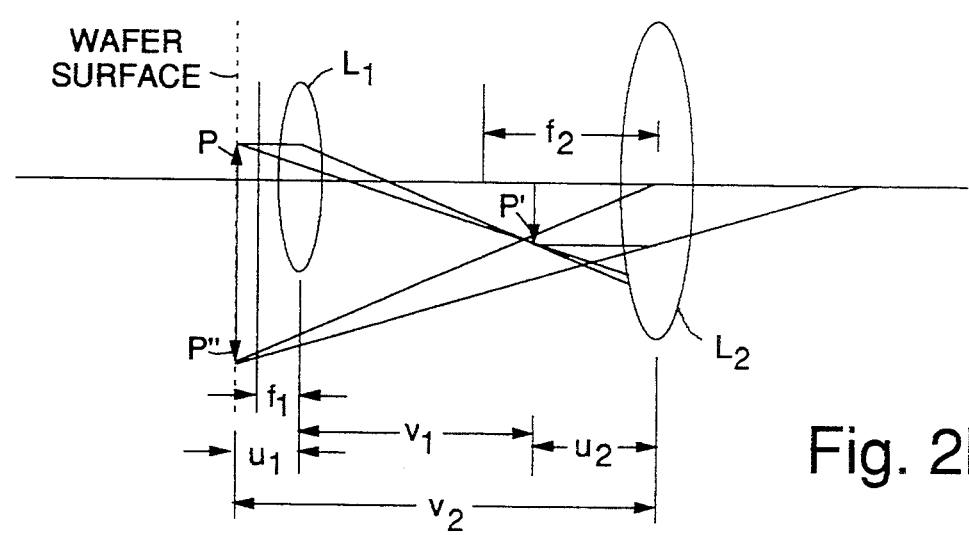

FIGS. 2a and 2b show paraxial solutions to the problem of inserting a magnifying system, comprising the moveable cofocal optical system 37, into an existing optical system without causing the final focal point (at the CCD array 35) to shift. Two lenses $L_1$, $L_2$ are shown in FIGS. 2a and 2b and correspond to the cofocal optical system 37 and the zoom lens 34, respectively in FIG. 1. In FIG. 2a, the first lens $L_1$ provides a virtual erect image P′ of the surface of the wafer 11 derived from an image P since the surface of the wafer 11 is located within the focal length of the first lens $L_1$. This virtual image P′ is magnified to produce image P″, but it is in the wrong plane and is moved back to the plane of the wafer 11 by being reimaged by the second (negative) lens $L_2$ to produce the image P‴. FIG. 2b shows a similar scheme using two positive lenses $L_1$, $L_2$ to reposition an inverted image P′ derived from an image P at the original object plane to produce the image P″. If $m_1$ and $m_2$ are the magnifications and $u_1$, $v_1$, $u_2$, $v_2$ are the object and image distances of the two lenses $L_1$, $L_2$, then $m = m_1 m_2$ and satisfies the condition $u_1 + u_2 + v_1 + v_2 = 0$, which ensures that the final image is in the original object plane. In this case the focal lengths $f_1$, $f_2$ of the two lenses $L_1$, $L_2$ are related by the equation $m_2(1+m_1)^2 f_1 + m_1(1+m_2)^2 f_2 = 0$. The cofocal condition occurs when $u_1 + u_2 + v_1 + v_2 = 0$. This condition constrains the image to be in the same plane as the object that is viewed (the wafer surface). In practice the magnifying system or moveable cofocal optical system 37 may need three positive lenses so that the pupils of the scattering screen 32 or the zoom lens 34 can be imaged onto one of the subsystem lens apertures.

Thus there has been described a new and improved optical systems for making film thickness measurements on patterned wafers that also allows determination of wafer position and orientation. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. An optical system for making thickness measurements of a subarea of a patterned wafer, said system comprising:
   light producing means for providing light to illuminate the patterned wafer;
   low resolution imaging means for imaging the wafer at a first predetermined resolution to create a low resolution image of the wafer at a focal plane;
   high resolution imaging means for imaging a subarea of the wafer at a relatively high predetermined resolution to create a high resolution image of the subarea and;
   processor means for determining the thickness of the subarea using data derived from the high and low resolution images.

2. The optical system of claim 1 further comprising a cofocal optical system for focussing the high resolution image at the focal plane.

3. The optical system of claim 2 wherein the high resolution imaging means is selected from the firoup consisting of a sparse array of lenses and a scanning lens that is adapted to focus an image onto an image producing means.

4. The optical system of claim 3 wherein the image producing means comprises a camera and a zoom lens that is adapted to focus an image onto the camera.

5. An optical system that is adapted to make film thickness measurements of a patterned wafer, said system comprising:
   a high intensity spectrally filtered light source;
   a fiber optic bundle optically coupled to the light source for transmitting light provided thereby;
   a lens group optically coupled to the fiber optic bundle for receiving the light transmitted thereby;
   a collimating lens optically coupled to the lens group for collimating the light transmitted thereby;
   a diffuser optically coupled to the collimating lens for causing the light to scatter therefrom to provide a diffused light source;
   a beamsplitter optically coupled to the diffuser for reflecting light onto the patterned wafer;
   a CCD array;
   a zoom lens for imaging light reflected from the wafer at a first predetermined low resolution onto the CCD to provide a low resolution wafer image in an object plane;

a moveable cofocal optical system disposed between the wafer and the zoom lens for imaging a small area of the wafer at a second predetermined resolution that is higher than the resolution of the zoom lens to provide a high resolution image in the same object plane as the wafer image; and a processor coupled to the CCD array that comprises a library containing reflectance values that correspond to different values of film thickness that are recalculated at different wavelengths, and wherein the processor comprises means for determining a reflectance of the wafer using the high and low resolution images, and means for comparing the computed reflectance to the precalculated values to determine the thickness of the film of the wafer corresponding thereto.

6. The optical system of claim 5 wherein the high intensity spectrally filtered light sottree comprises a halogen lamp.

7. The optical system of claim 5 wherein the lens group comprises a concave lens and a convex lens.

8. The optical system of claim 7 wherein the high intensity spectrally filtered light source comprises a motor drive coupled to a filter wheel.

9. The optical system of claim 8 wherein the filter wheel is disposed between the concave lens and the convex lens.

10. The optical system of claim 8 wherein the motor drive and filter wheel is adapted to insert one of a plurality of filters between the concave lens and the convex lens.

11. The optical system of claim 5 wherein the collimating lens comprises plastic.

12. The optical system of claim 5 wherein the diffuser comprises a ground glass plate.

13. The optical system of claim 5 wherein the processor is adapted to determine the thickness of the film of the wafer using a least squares fitting technique.

* * * * *